(12) United States Patent
Lacan et al.

(10) Patent No.: US 12,086,008 B2
(45) Date of Patent: Sep. 10, 2024

(54) ELECTRONIC SYSTEM COMPRISING A CONTROL UNIT CONFIGURED TO COMMUNICATE WITH A MEMORY

(71) Applicants: STMicroelectronics (Rousset) SAS, Rousset (FR); STMicroelectronics Design and Application S.R.O., Prague (CZ)

(72) Inventors: Jerome Lacan, Trets (FR); Remi Collette, Meyreuil (FR); Christophe Eva, Rousset (FR); Milan Komarek, Uvaly (CZ)

(73) Assignees: STMicroelectronics (Rousset) SAS, Rousset (FR); STMicroelectronics Design and Application S.R.O., Prague (CZ)

( * ) Notice: Subject to any disclaimer, the term of this patent is extended or adjusted under 35 U.S.C. 154(b) by 40 days.

(21) Appl. No.: 17/942,354

(22) Filed: Sep. 12, 2022

(65) Prior Publication Data
US 2023/0085493 A1    Mar. 16, 2023

(30) Foreign Application Priority Data

Sep. 14, 2021  (FR) ...................................... 2109606

(51) Int. Cl.
*G06F 1/3225* (2019.01)
*G06F 1/3287* (2019.01)
*H03K 19/017* (2006.01)

(52) U.S. Cl.
CPC .......... *G06F 1/3225* (2013.01); *G06F 1/3287* (2013.01); *H03K 19/01742* (2013.01)

(58) Field of Classification Search
CPC ................ G06F 1/3225; G06F 1/3287; H03K 19/01742
See application file for complete search history.

(56) References Cited

U.S. PATENT DOCUMENTS

| | | | |
|---|---|---|---|
| 9,142,280 B1 * | 9/2015 | Pandey ............... | G11C 11/4093 |
| 9,395,919 B1 * | 7/2016 | Chu ....................... | G06F 9/4406 |
| 9,792,962 B1 * | 10/2017 | La Rosa .................. | G11C 7/08 |
| 2011/0058439 A1 * | 3/2011 | Lee .......................... | G11C 8/08 |
| | | | 365/226 |

(Continued)

OTHER PUBLICATIONS

INPI Search Report and Written Opinion for priority application, FR 2109606, report dated Apr. 8, 2022, 8 pgs.

*Primary Examiner* — Nimesh G Patel
(74) *Attorney, Agent, or Firm* — Crowe & Dunlevy LLC (57) ABSTRACT

A system includes a control unit configured to be electrically connected to an input of a memory via a communication interface. The control unit includes a first power supply sector configured to be powered when the control unit is in an operating mode and a second power supply sector configured to be powered when the control unit is in the operating mode and in a low consumption mode. In the first power supply sector, the control unit includes a first configuration circuit operating to configure a polarization value of the input of the memory via the communication interface for the operating mode. In the second power supply sector, the control unit includes a second configuration circuit operating to configure a polarization value of the input of the memory via the communication interface for the low consumption mode.

22 Claims, 7 Drawing Sheets

(56) References Cited

U.S. PATENT DOCUMENTS

| | | | |
|---|---|---|---|
| 2015/0194208 A1* | 7/2015 | Nagle | G11C 8/08 |
| | | | 365/154 |
| 2018/0102776 A1 | 4/2018 | Chandrasekar et al. | |
| 2018/0267598 A1* | 9/2018 | Pulivendula | G06F 9/4406 |
| 2019/0385668 A1* | 12/2019 | Fujioka | G11C 7/04 |
| 2020/0105321 A1* | 4/2020 | Sinangil | G11C 5/147 |
| 2020/0143850 A1* | 5/2020 | Kim | H03K 19/1733 |
| 2023/0140988 A1* | 5/2023 | Jian | G11C 5/147 |
| | | | 365/226 |

* cited by examiner

ELECTRONIC SYSTEM COMPRISING A CONTROL UNIT CONFIGURED TO COMMUNICATE WITH A MEMORY

PRIORITY CLAIM

This application claims the priority benefit of French Application for Patent No. 2109606, filed on Sep. 14, 2021, the content of which is hereby incorporated by reference in its entirety to the maximum extent allowable by law.

TECHNICAL FIELD

Embodiments and implementations relate to communication between a control unit and a peripheral device, for example the configuration of the inputs/outputs of a memory using a control unit such as a microcontroller.

BACKGROUND

A microcontroller includes functions and a limited capacity, particularly in terms of memory. In order to increase the functions and capacity of the microcontroller, at least one input/output interface is generally provided in the microcontroller and configured to be electrically connected to a peripheral device in order to be able to communicate therewith. The peripheral device makes it possible to increase the functions or capacity of the microcontroller. For example, the peripheral device may be a memory making it possible to increase the storage space of the microcontroller.

More specifically, the memory comprises at least one input/output electrically connected to an input/output port of the microcontroller. The microcontroller comprises a configuration circuit for configuring each input/output of the memory. The configuration of each input/output of the memory comprises a defining a polarization value to be applied to the input/output of the memory. The polarization value to be applied to the input/output of the memory can correspond to a high logic state or to a low logic state.

Moreover, it is possible to define different power supply modes of the microcontroller. The use of different power supply modes makes it possible to avoid unnecessary power consumption during periods when the microcontroller is idle. In particular, the microcontroller can be in a so-called operating power supply mode (or active mode) or in a low consumption mode (or standby mode). Operating mode is used to power all of the elements of the microcontroller when the microcontroller is operating normally. Low consumption mode is used when the functions of the microcontroller are not used, and makes it possible to only power the elements of the microcontroller which need to be kept constantly powered.

The microcontroller can thus comprise different power supply sectors which are powered according to the power supply mode applied to the microcontroller. Each power supply sector comprises a set of microcontroller elements which are powered in the same way according to the power supply mode activated for the microcontroller.

In particular, two power supply sectors can be defined. A first sector can comprise a set of microcontroller elements to be powered only when the microcontroller is in the operating mode. The elements of the first sector are therefore not powered when the microcontroller is in the low consumption mode. A second sector can comprise a set of microcontroller elements which need to be powered constantly. The elements of the second sector are therefore powered when the microcontroller is in the operating mode, and also when the microcontroller is in the low consumption mode.

The configuration circuit of the microcontroller for configuring each input/output is placed in the first power supply sector. Thus, when the microcontroller is in the low consumption mode thereof, the configuration circuit is not powered and is therefore reset. Consequently, the configuration circuit is no longer capable of defining the configuration of each input/output of the memory when the microcontroller is in the low consumption mode thereof. Particularly, in this case, each memory input/output becomes floating as the microcontroller does not impose a high logic state or a low logic state on this input/output. Each input/output is therefore in a high impedance state. However, when a memory input/output is floating, the polarization value which is applied thereto is between the polarization value corresponding to a high logic state and that corresponding to a low logic state. In this way, the polarization value applied to the memory input/output can be considered sometimes as corresponding to a high logic state and sometimes as corresponding to a low logic state. This can give rise to untimely activation or deactivation of the input/output. Untimely activation of the memory input/output can result in an undesirable configuration of the memory input/output. For example, shutting down the power supply of the configuration circuit can be the cause of an unexpected modification of the data saved in this memory. Untimely activation of the memory input can also cause leakage currents which reduce the battery life of a battery powering the microcontroller.

Therefore, there is a need for a solution to carry out a configuration of the memory at any time, even when the control unit is in the low consumption mode.

SUMMARY

According to an aspect, a system comprises a control unit configured to be able to be electrically connected to an input of a memory via a communication interface, wherein the control unit has two power supply sectors: a first power supply sector configured to be powered when the control unit is in an operating mode and to be switched off when the control unit is in a low consumption mode, and a second power supply sector configured to be powered when the control unit is in the operating mode and in the low consumption mode, wherein the first power supply sector of the control unit includes a first configuration circuit operating to configure a polarization value of the memory input via the communication interface when the control unit is in the operating mode, and wherein the second power supply sector of the control unit includes a second configuration circuit operating to configure the polarization value of the memory input via the communication interface when the control unit is in the low consumption mode.

In particular, the first power supply sector comprises a set of control unit elements which are only powered when the control unit is in said operating mode and is therefore active, in order to ensure execution of the functions that can be implemented by the control unit. The control unit elements of the first power supply sector are therefore not powered when said low consumption mode is applied to the control unit in order to reduce the consumption of the control unit. Thus, the first configuration circuit, which is part of the first power supply sector, is not powered when the control unit is in the low consumption mode. The first configuration circuit therefore cannot be used for configuring the memory input when the control unit is in the low consumption mode.

Nevertheless, the configuration of the memory input when the control unit is in the low consumption mode is allowed by the second configuration circuit. Indeed, the second configuration circuit is comprised in the second power supply sector and is therefore kept powered when the control unit is in said operating mode, but also when the control unit is in the low consumption mode. Thus, the second configuration circuit can be used for configuring the memory input when the control unit is in the low consumption mode.

The memory input can thus be configured by the first configuration circuit when the control unit is in said operating mode and by the second configuration circuit when the control unit is in the low consumption mode.

In this way, a logic state is constantly applied to the memory input. Thus, the memory input is never floating. This makes it possible to reduce the risks of untimely activation and deactivation of the memory. This also makes it possible to prevent an appearance of a leakage current capable of resulting in an untimely activation of the memory. Thus, the power consumption of the system can be reduced.

In an advantageous embodiment, selection circuits are configured to select said first configuration circuit to configure the polarization value of the memory input when the control unit is in the operating mode or select said second configuration circuit to configure the polarization value of the memory input when the control unit is in the low consumption mode.

The selection circuits thus make it possible to select the configuration circuit for configuring the polarization value of the memory input according to the power supply mode applied to the control unit.

In an advantageous embodiment, the first and second configuration circuits are configured to apply a high logic state or a low logic state to the memory input.

By applying a high or low memory state to the memory input, the first and second configuration circuits maintain the control of the state of the memory input and prevent the latter from being in a high impedance state.

In an advantageous embodiment, a pull-up resistor is configured to be connected to the communication interface for applying the high logic state to the memory input, a pull-down resistor is configured to be connected to the communication interface for applying the low logic state to the memory input and switches make it possible to activate or deactivate the pull-up resistor and the pull-down resistor according to the logic state to be applied to the memory input defined by the first and second configuration circuits. The pull-up and pull-down resistor and the switches make it possible to apply a logic state to the memory input in a simple way.

In an advantageous embodiment, the pull-up resistor and the pull-down resistor are provided in an input/output port of the control unit configured to be connected to the memory input via the communication interface.

Such a system then has the advantage of using the pull-up and pull-down resistors which are generally already provided in the input/output ports of a microcontroller to apply the configuration defined by the first and second configuration circuits. It is then not necessary to add further pull-up and pull-down resistors in the system to apply the configuration. This helps facilitate the manufacture of the system and reduce the cost thereof.

Nevertheless, alternatively, the pull-up resistor and the pull-down resistor can be connected to the communication interface between the microcontroller and the memory.

In an advantageous embodiment, the first configuration circuit comprises a configuration register defining a configuration of the polarization value of the memory input when the control unit is in the operating mode, this configuration register being provided in an input/output port of the control unit configured to be connected to the memory input via the communication interface.

In an advantageous embodiment, the second configuration circuit comprises a configuration register defining a configuration of the polarization value of the memory input when the control unit is in the low consumption mode, this configuration register being provided in an input/output port of the control unit configured to be connected to the memory input via the communication interface.

In an advantageous embodiment, the polarization value of the memory input to be configured is adapted to activate or deactivate the memory. The second configuration circuit is then adapted to configure this polarization value of the memory input to deactivate the memory when the control unit is in the low consumption mode.

The second configuration circuit then makes it possible to deactivate the memory when the control unit is in the low consumption mode. This makes it possible to reduce the power consumption of the memory.

By configuring the polarization value of the inputs of a memory, the risk of modifying the information stored in this type of peripheral device is reduced particularly when the control unit is in a low consumption mode.

Embodiments herein also relate to a method for configuring a polarization value of an input of a memory by a control unit electrically connected to the memory input via a communication interface, the control unit having two power supply sectors: a first power supply sector configured to be powered when the control unit is in an operating mode and to be switched off when the control unit is in a low consumption mode and a second power supply sector configured to be powered when the control unit is in the operating mode and in the low consumption mode, the method comprising: configuring the polarization value of the memory input via the communication interface using a first control unit configuration circuit placed in the first power supply sector when the control unit is in the operating mode and configuring the polarization value of the memory input via the communication interface using a second control unit configuration circuit placed in the second power supply sector when the control unit is in the low consumption mode.

In an advantageous implementation, the method further comprises selecting by selection circuits of said first control unit configuration circuit to configure the polarization value of the memory input when the control unit is in the operating mode and said second configuration circuit to configure the polarization value of the memory input when the control unit is in the low consumption mode.

Advantageously, the method comprises applying by the first and second configuration circuits of a high logic state or a low logic state to the memory input. Preferably, the high logic state is applied by a pull-up resistor configured to be connected to said communication interface and the low logic state is applied by a pull-down resistor configured to be connected to said communication interface, the method further comprising: using switches to activate or deactivate said pull-up resistor and said pull-down resistor according to the logic state to be applied to the memory input defined by said first and second configuration circuits.

In an advantageous implementation, the configuration of the polarization value of the memory input by the first configuration circuit is defined by a configuration register comprised in the first configuration circuit when the control unit is in the operating mode, this configuration register being provided in an input/output port of the control unit configured to be connected to the memory input via said communication interface.

Advantageously, the configuration of the polarization value of the memory input by the second configuration circuit is defined by a configuration register comprised in the second configuration circuit when the control unit is in the low consumption mode, this configuration register being provided in an input/output port of the control unit configured to be connected to the memory input via said communication interface.

In an advantageous implementation, the polarization value of the memory input to be configured is configured to activate or deactivate the memory. The method further comprises: deactivating the memory during the configuration of the polarization value of the memory input by the second configuration circuit when the control unit is in the low consumption mode.

BRIEF DESCRIPTION OF THE DRAWINGS

Further advantages and features of the invention will emerge on studying the detailed description of implementations and embodiments, which are in no way restrictive, and of the appended drawings wherein.

DETAILED DESCRIPTION

Figure 1:
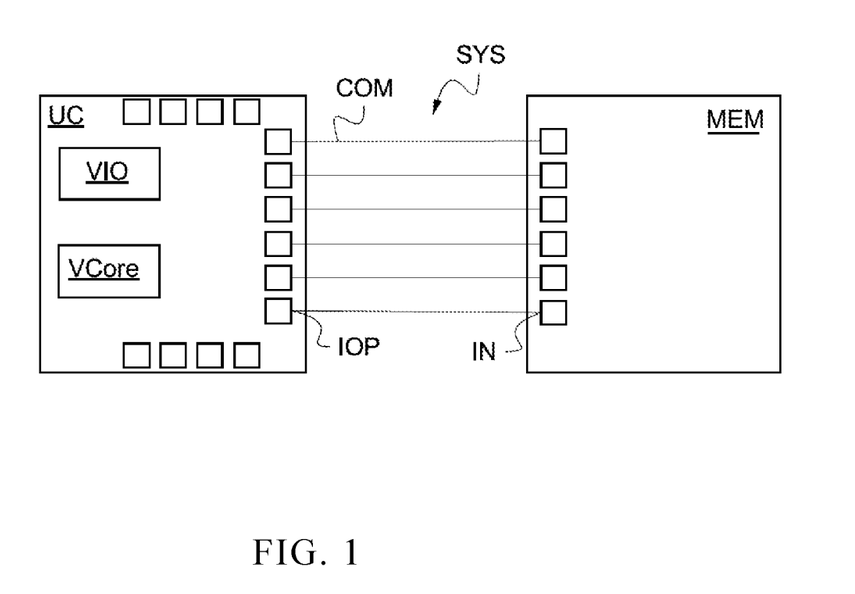
FIG. 1 illustrates a system with a control unit and a memory.

FIG. 1 illustrates the system SYS according to an embodiment. The system comprises a control unit UC and a memory MEM. The control unit UC can be a microcontroller for example.

In order to be able communicate with the memory MEM, the control unit UC comprises input/output ports IOP electrically connected to inputs/outputs IN of the memory MEM via a communication interface COM. In particular, the control unit UC operates to configure the input/outputs IN of the memory MEM using configuration circuits described below.

Moreover, the control unit UC is configured to be powered using a power supply source, particularly a battery, according to different power supply modes. The use of different power supply modes makes it possible to avoid unnecessary power consumption during periods when the control unit UC is idle. In particular, the control unit UC can be in a so-called operating power supply mode (operating mode or active mode) or in a low consumption mode (or standby mode). Operating mode is used to power all of the elements of the control unit UC when the control unit UC is operating normally. Low consumption mode is used when the functions of the control unit UC are not used. This low consumption mode makes it possible to power only the elements of the control unit UC which need to be kept constantly powered.

The control unit UC thus comprises different power supply sectors which are powered according to the power supply mode applied to the control unit UC. Each power supply sector comprises a set of elements of the control unit UC which are powered in the same way according to the power supply mode activated for the control unit UC.

In particular, two power supply sectors VCore and VIO are defined. A first power supply sector VCore comprises a set of elements of the control unit UC to be powered only when the control unit UC is in the operating mode thereof. The elements of the first power supply sector VCore are therefore not powered when the control unit UC is in the low consumption mode. A second power supply sector VIO comprises a set of elements of the control unit UC which need to be powered constantly. The elements of the second power supply sector VIO are therefore powered when the control unit UC is in the operating mode, but also when the control unit UC is in the low consumption mode. The control unit UC can further include further first power supply sectors VCore and further second power supply sectors VIO as well as optionally several further power supply sectors. The further power supply sectors then comprise a set of elements of the control unit UC to be powered when the control unit UC is in the operating mode and which can optionally be powered when the control unit UC is in the low consumption mode.

Figure 2:
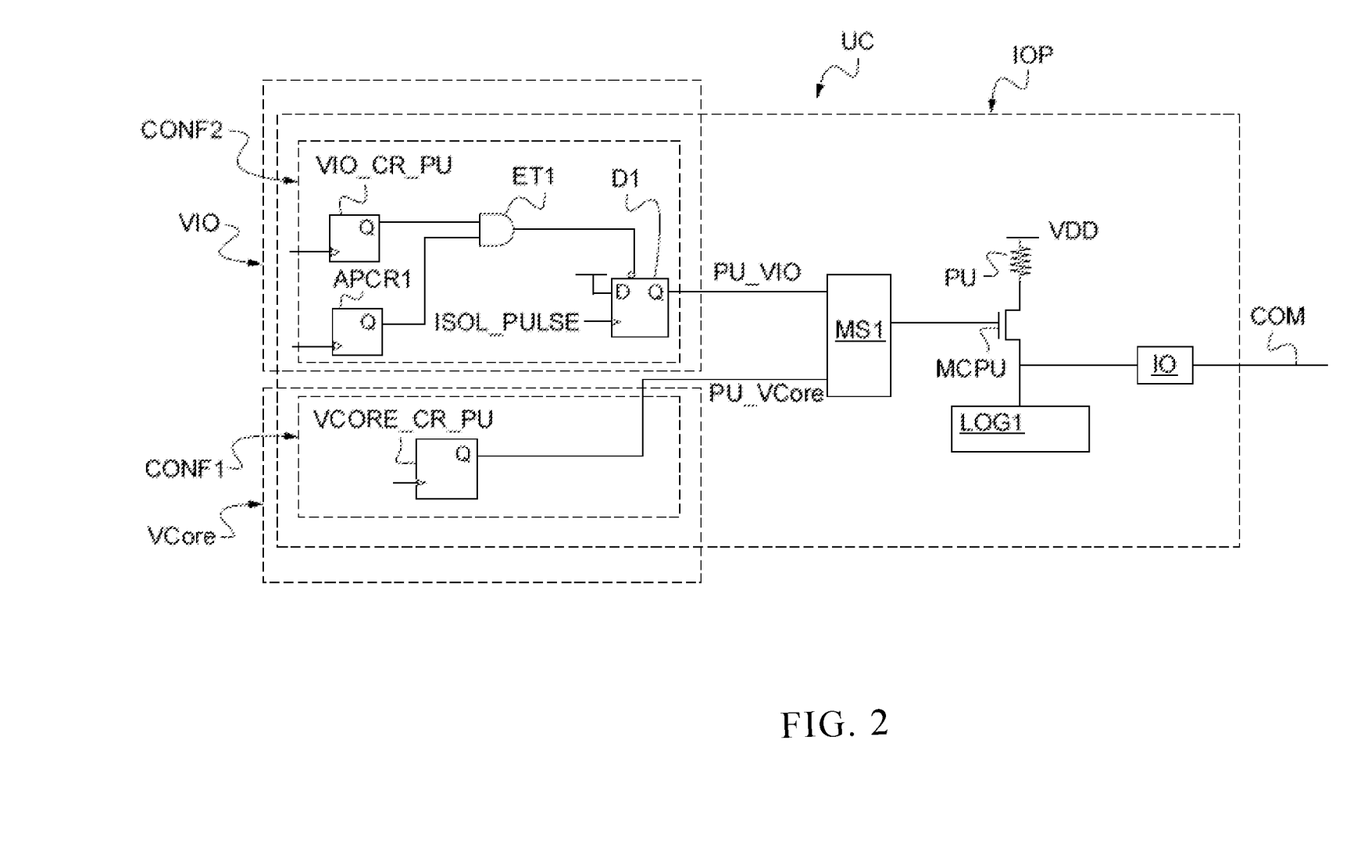
FIGS. 2 and 3 schematically illustrate a system showing embodiments of the configuration circuit of the control unit.
Figure 3:
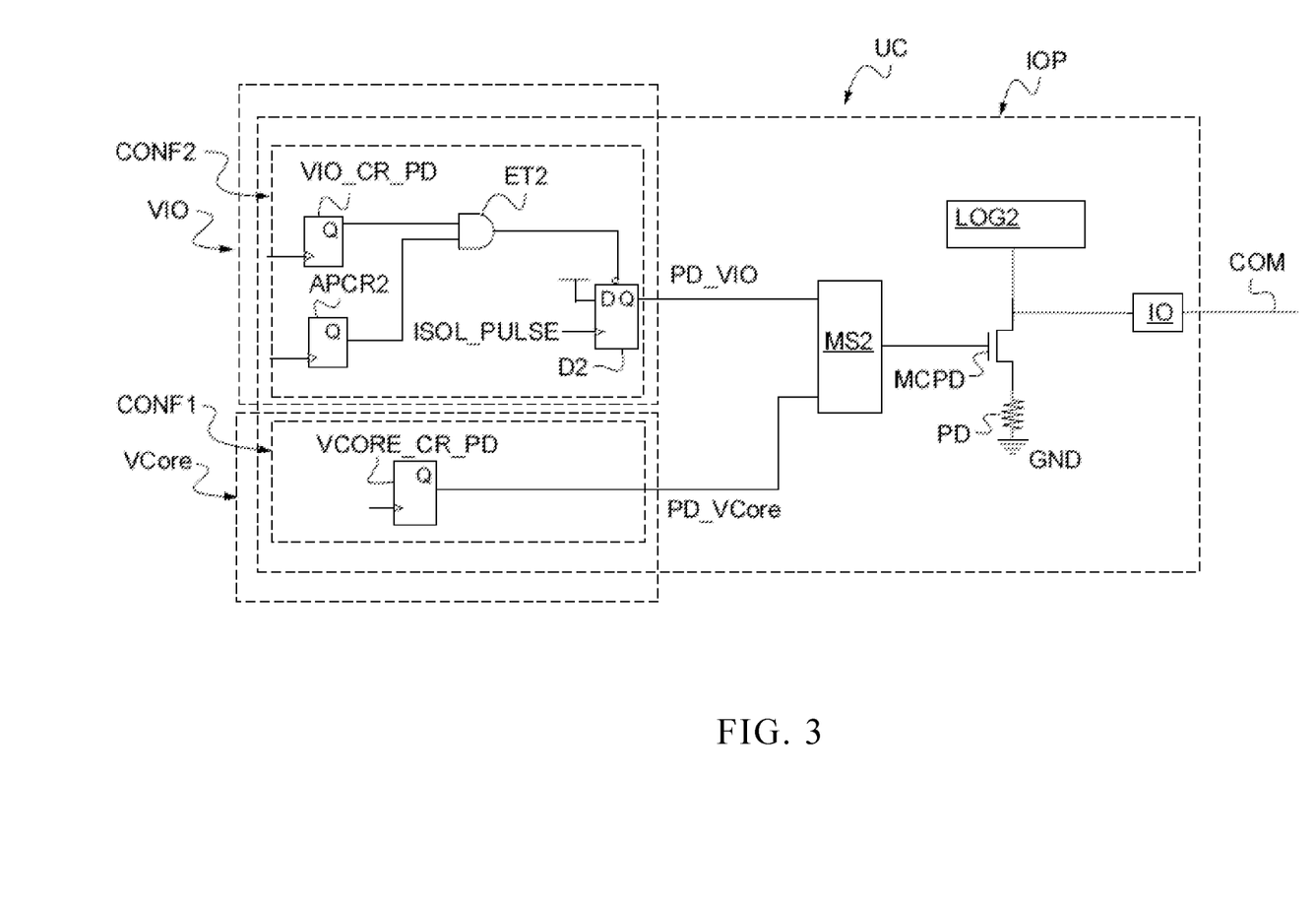

FIGS. 2 and 3 schematically illustrate a system SYS showing embodiments of the configuration circuits of the control unit UC. These configuration circuits are configured to define a configuration to be applied to the input IN of the memory MEM.

The configuration of the input IN of the memory MEM comprises applying a high logic state or a low logic state to the input IN of the memory MEM.

In order to apply the configuration defined by the configuration circuits to the input IN of the memory MEM, the system SYS comprises a pull-up resistor PU and a pull-down resistor PD connected to the communication interface COM connected to the input IN of the memory MEM. These pull-up PU and pull-down PD resistors can be activated or deactivated by switches MCPU and MCPD according to the configuration defined by the configuration circuits.

In particular, the pull-up resistor PU makes it possible to apply the high logic state to the input IN of the memory MEM, and the pull-down resistor PD makes it possible to apply the low logic state to the input IN of the memory MEM.

FIG. 2 illustrates the configuration circuit for applying a high logic state to the input IN of the memory MEM using the pull-up resistor PU, and FIG. 3 illustrates the configuration circuit for applying a low logic state to the input IN of the memory MEM using the pull-down resistor PD.

More specifically, the pull-up resistor PU has a first terminal connected to the communication interface COM via the switch MCPU and a second terminal connected to a power supply source VDD. Furthermore, the pull-down resistor PD has a first terminal connected to the communication interface COM via the switch MCPD and a second terminal connected to a cold point, particularly a ground GND. The switches MCPU and MCPD can be MOS transistors.

Here, the pull-up PU and pull-down PD resistors are integrated in input/output ports IOP of the control unit UC. Alternatively, and as described hereinafter with reference to FIG. 6, it is possible to place the pull-up PU and pull-down PD resistors outside the control unit UC. Nevertheless, the use of pull-up PU and pull-down PD resistors integrated in input/output ports IOP to apply the configuration defined by the configuration circuit has the advantage of being able to use pull-up PU and pull-down PD resistors already generally provided in the input/output ports IOP of the control unit UC. This helps facilitate the manufacture of the system SYS and reduce the cost thereof.

Moreover, as mentioned above, the configuration circuit makes it possible to define the configuration to be applied to the input IN of the memory MEM. In particular, the configuration circuit is adapted to control the switches MCPU and MCPD associated with the pull-up PU and pull-down PD resistors according to the defined configuration.

The configuration circuit, illustrated in FIG. 2, for applying a high state to the input IN of the memory MEM is identical to the configuration circuit, illustrated in FIG. 3, for applying a low state to the input IN of the memory MEM.

More specifically, the control unit UC includes first configuration circuit CONF1 comprised in the first power supply sector VCore and second configuration circuit CONF2 comprised in the second power supply sector VIO.

Thus, the first configuration circuit CONF1 is only powered when the control unit UC is in the operating mode. The first configuration circuit CONF1 is therefore used for defining the configuration of the input IN of the memory MEM only when the control unit UC is in the operating mode.

Furthermore, the second configuration circuit CONF2 is powered when the control unit UC is in the operating mode, but also when the control unit UC is in the low consumption mode. The second configuration circuit CONF2 is used for defining the configuration of the input IN of the memory MEM when the control unit UC is in the low consumption mode.

The input IN of the memory MEM can thus be configured by the first configuration circuit CONF1 when the control unit UC is in the operating mode and by the second configuration circuit CONF2 when the control unit UC is in the low consumption mode.

In this way, a logic state is constantly applied to the input IN of the memory MEM. Thus, the input IN of the memory MEM is never floating. This makes it possible to reduce the risks of untimely activation and deactivation of the memory MEM. This also makes it possible to prevent an appearance of a leakage current capable of resulting in an untimely activation of the memory MEM. Thus, the power consumption of the system SYS can be reduced.

More specifically, the first configuration circuit CONF1 comprises a configuration register VCORE_CR_PU defining a configuration of the polarization value of the input IN of the memory MEM when the control unit UC is in the operating mode. This configuration register VCORE_CR_PU is provided in an input/output port IOP of the control unit UC configured to be connected to the input IN of the memory MEM via the communication interface COM.

The configuration register VCORE_CR_PU receives at the input an activation signal and can store a configuration of the polarization value. When the activation signal emits a pulse, the configuration register VCORE_CR_PU stores a new configuration of the polarization value. This polarization value corresponds to the polarization value to be configured at the input IN of the memory MEM when the control unit UC is in the operating mode.

The first configuration circuit CONF1 also comprises a further configuration register VCORE_CR_PD identical to the configuration register VCORE_CR_PU capable of storing an identical or different configuration of the polarization value.

By storing the configuration of the polarization value in the configuration register VCORE_CR_PU and VCORE_CR_PD, the first configuration circuit CONF1 can save the configuration of the polarization value when the control unit UC is in the operating mode. This configuration is used to configure the polarization value of the input IN of the memory MEM when the control unit UC is in the operating mode.

The second configuration circuit CONF2 comprises a configuration register VIO_CR_PU defining a configuration of the polarization value of the input IN of the memory MEM when the control unit UC is in the low consumption mode. This configuration register VIO_CR_PU is provided in an input/output port of the control unit UC configured to be connected to the input IN of the memory MEM via the communication interface COM.

The configuration register VIO_CR_PU receives an activation signal and can store a configuration of the polarization value. When the activation signal emits a pulse, the configuration register VIO_CR_PU stores a new configuration of the polarization value. This polarization value corresponds to the polarization value to be configured on the input IN of the memory MEM when the control unit UC is in the low consumption mode.

The second configuration circuit CONF2 also comprises a logic gate ET1, a control register APCR1 and a flip-flop D1.

The control register APCR1 receives at the input the same activation signal and makes it possible to optionally apply the configuration. The registers VIO_CR_PU and APCR1 then respectively transmit a signal corresponding to the configuration of the polarization value and an input control signal of the logic gate ET1. The logic gate ET1 makes it possible, based on the signals received, to send the flip-flop D1 a reset signal.

The flip-flop D1 has the input 'D' always set to the high logic state, a reset input configured to receive the reset signal, an input configured to receive an activation signal ISO_PULSE and an output 'Q' for transmitting a control signal PU_VIO.

The value of the input 'D' corresponding to the high logic state is transmitted to the output 'Q' at each pulse of the activation signal ISO_PULSE. This pulse corresponds to an activation of low consumption mode of the control unit UC by the user.

When the flip-flop D1 receives the reset signal, the flip-flop D1 is automatically reset such that a low logic state is transmitted to the output 'Q'.

The second configuration circuit CONF2 also comprises a further configuration register VIO_CR_PD, a further logic gate ET2, a further control register APCR2 and a further flip-flop D2.

The configuration register VIO_CR_PD is identical to the configuration register VIO_CR_PU and can store an identical or different configuration of the polarization value. The logic gate ET2 and the control register APCR2 are respectively identical to the logic gate ET1 and the control register APCR1. The flip-flop D2 is identical to the flip-flop D1 but the output 'Q' thereof makes it possible to transmit a control signal PD_VIO.

By storing the configuration of the polarization value in the configuration register VIO_CR_PU and VIO_CR_PD, the second configuration circuit CONF2 can save the configuration of the polarization value when the control unit is in the operating mode. The user can then choose to optionally apply this configuration to an input/output port IOP of the control unit UC connected to the input IN to be configured. This configuration is used to configure the polarization value of the input IN of the memory MEM when the user activates low consumption mode of the control unit UC after operating mode.

The first and second configuration circuits CONF1 and CONF2 are adapted to apply a high logic state to the input IN of the memory MEM and a low logic state to the input IN of the memory MEM. The logic state applied then defines the polarization value of the input IN of the memory MEM and makes it possible to prevent this polarization value from changing at random and uncontrollably when the control unit UC is in the low consumption mode.

Moreover, the system SYS further comprises selection circuits MS1, MS2 configured to select the first configuration circuit CONF1 or the second configuration circuit CONF2 to configure the input IN of the memory MEM. In particular, the selection circuits MS1, MS2 are configured to select the first configuration circuit CONF1 when the control unit UC is in the operating mode, and to select the second configuration circuit CONF2 when the control unit UC is in the low consumption mode.

Figure 4:
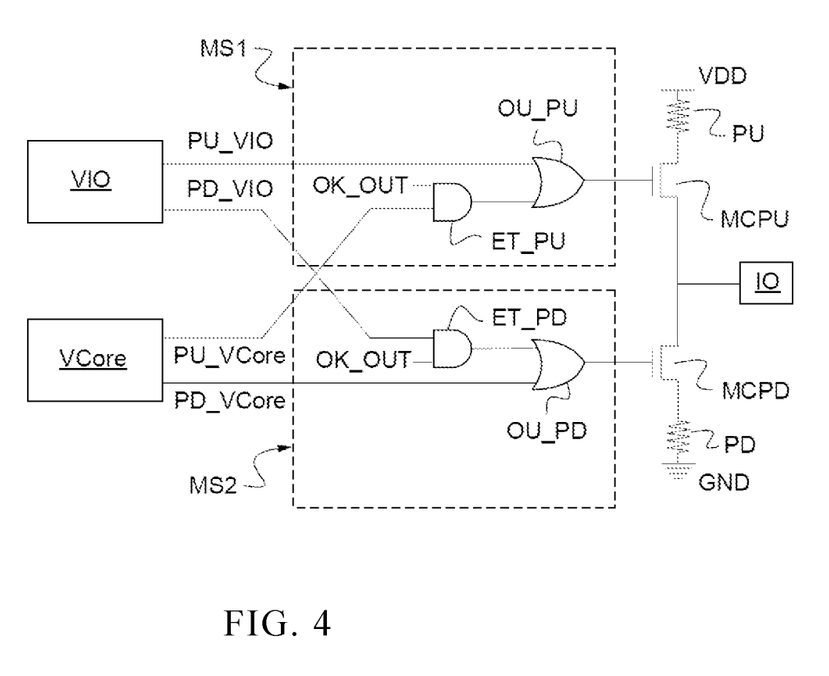
FIG. 4 illustrates details of a selection circuit.

The selection circuits MS1, MS2 is detailed in FIG. 4.

In particular, the selection circuit comprises a selection circuit MS1 for controlling the pull-up resistor PU and a selection circuit MS2 for controlling the pull-down resistor PD.

The selection circuit MS1 comprises a logic gate ET_PU and a logic gate OU_PU. The gate ET_PU is configured to perform a logic operation ET between the signal PU_VCore of the first configuration circuit CONF1 and a control signal OK_OUT.

The signal OK_OUT is generated by the control unit UC. In particular, this circuit can comprise a regulator configured to deliver a power supply voltage to the power supply sector VCore. Thus, the circuit generates a signal OK_OUT of value '1' when the power supply sector VCore is powered and generates a signal OK_OUT of value '0' when the power supply sector VCore is not powered.

The gate ET_PU transmits to the gate OU_PU a signal corresponding to the result of the logic operation ET. The gate OU_PU is configured to perform a logic operation OU between the signal transmitted by the gate ET_PU and the signal PU_VIO of the second configuration circuit CONF2. The gate OU_PU then generates a signal corresponding to the result of the logic operation OU. Thus, according to the value of the signal OK_OUT received by the gate ET_PU, the gate OU_PU can generate a signal corresponding either to the signal PU_VIO, or to the signal PU_VCore. The gate OU_PU then transmits this signal to switches MCPU.

The selection circuit MS2 comprises a logic gate ET_PD and a logic gate OU_PD. The gate ET_PD is configured to perform a logic operation ET between the signal PU_VIO of the second configuration circuit CONF2 and a control signal OK_OUT. The gate ET_PD transmits to the gate OU_PD a signal corresponding to the result of the logic operation ET. The gate OU_PD is configured to perform a logic operation OU between the signal transmitted by the gate ET_PD and the signal PU_VCore of the first configuration circuit CONF1. The gate OU_PD then generates a signal corresponding to the result of the logic operation OU. Thus, according to the value of the signal OK_OUT received by the gate ET_PD, the gate OU_PD can generate a signal corresponding either to the signal PD_VIO, or to the signal PD_VCore. The gate OU_PD then transmits this signal to switches MCPD.

The switches MCPU make it possible to activate or deactivate the pull-up resistor PU.

Figure 5:
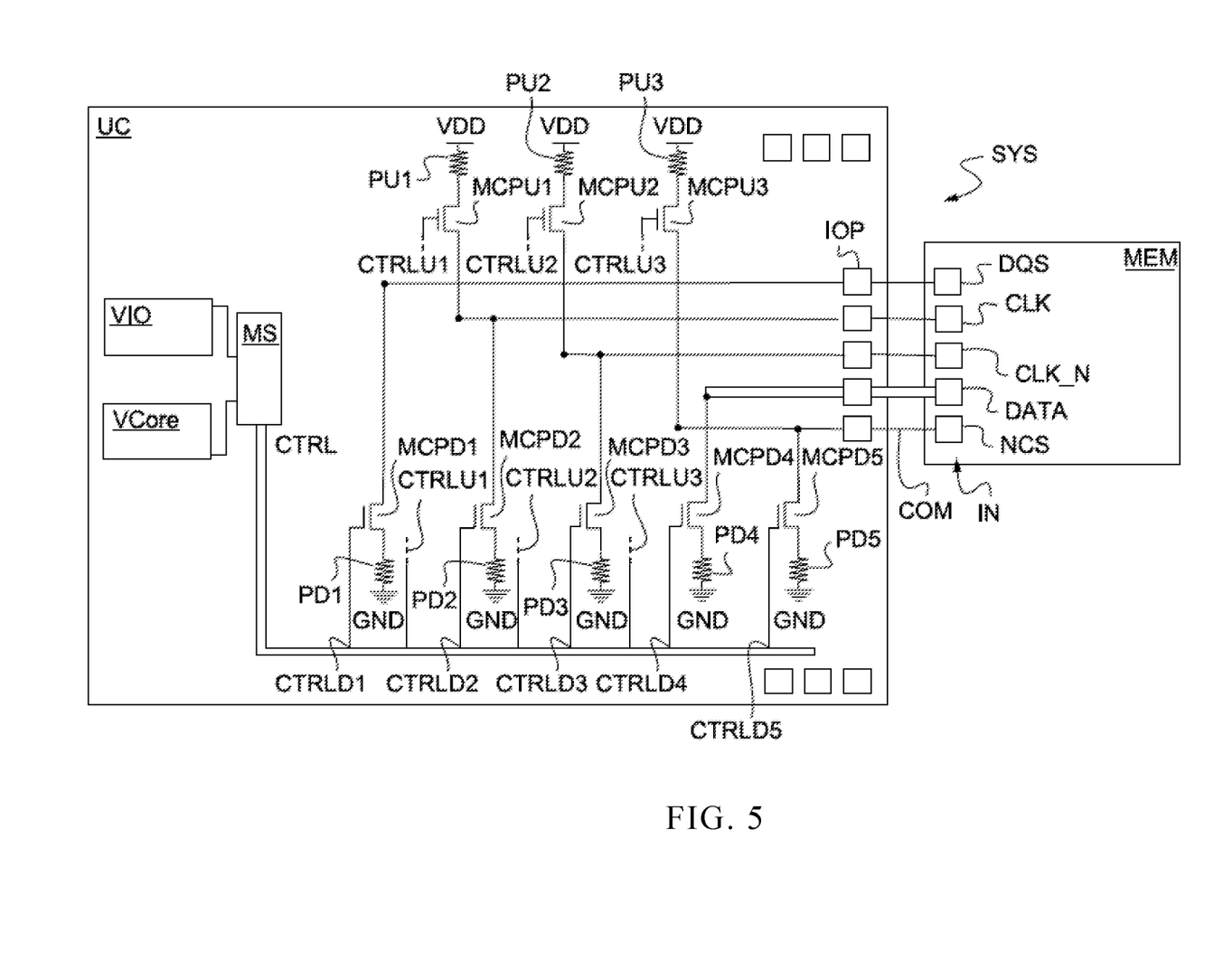
FIG. 5 illustrates a memory configuration system according to a first embodiment wherein the control unit comprises a multitude of input/output ports.

FIG. 5 illustrates the memory configuration system according to the first embodiment wherein the control unit UC comprises a multitude of input/output ports IOP. Each of the input/output ports IOP is electrically connected to an input IN in turn associated with the memory MEM thus forming a communication interface COM. Each communication interface COM makes it possible to exchange data between the control unit UC and the memory MEM. According to the nature of the input IN of the memory MEM, the user may be required to observe a specific communication protocol in order to transmit data to this input IN so as to obtain the desired configuration of the memory MEM.

For example, a memory MEM can have clock CLK and CLK_N, data DATA, peripheral device selection NCS and data sampling DQS inputs.

In the same example, the input/output ports IOP of the control unit UC are adapted to form a link SPI with the inputs CLK, CLK_N, DATA NCS and DQS in order to configure the memory MEM.

The control unit UC comprises a control bus CTRL and several selection circuits MS. The selection circuits generate control signals CTRLU1, CTRLU2, CTRLU3, CTRLD1, CTRLD2, CTRLD3, CTRLD4 and CTRLD5 to control the switches MCPU1, MCPU2, MCPU3, MCPD1, MCPD2 MCPD3, MCPD4 and MCPD5. The control bus CTRL makes it possible to connect each selection circuit to the associated switch and then makes it possible to transmit the control signals to the switches.

The user should then use the protocol associated with the type of link formed by the input/output ports IOP of the control unit UC and the inputs IN of the memory MEM, such as for example the link SPI.

In a communication protocol such as that of SPI, the input NCS makes it possible to activate or deactivate the memory MEM according to the polarization value thereof. This input NCS is known as "Chip Select". The second configuration circuit CONF2 are then adapted to configure this polarization value of the input NCS of the memory MEM to deactivate the memory MEM when the control unit UC is in the low consumption mode.

Thus, the user can select the memory MEM with which the control unit UC communicates by activating or deactivating the memory MEM according to the polarization value of the input NCS. The user can particularly deactivate the memory MEM when the control unit UC is in the low consumption mode, which makes it possible to reduce the power dissipation by the memory MEM in this low consumption mode. It can for example be provided that a high logic state applied to the input NCS of the memory MEM deactivates the memory MEM.

The pull-up PU and pull-down PD resistors are provided in an input/output port IOP of the control unit UC configured to be connected to the input IN of the memory MEM.

Preferably, each input/output port IOP of the control unit UC provides both a pull-up resistor PU and a pull-down resistor PD. The user can then select the logic state to be applied at the input IN of the memory MEM according to the configuration of the polarization value previously stored in the register VCORE_CR_PU, VCORE_CR_PD, VIO_CR_PU or VIO_CR_PD. However, a single pull-up resistor PU can be provided in the input/output port IOP of the control unit UC. Similarly, a single pull-down resistor PD can be provided in the input/output port IOP of the control unit UC.

As seen above, integrating the pull-up PU and pull-down PD resistors in the input/output ports IOP of the control unit UC, the control unit UC makes it possible to simplify the manufacture of the system.

Figure 6:
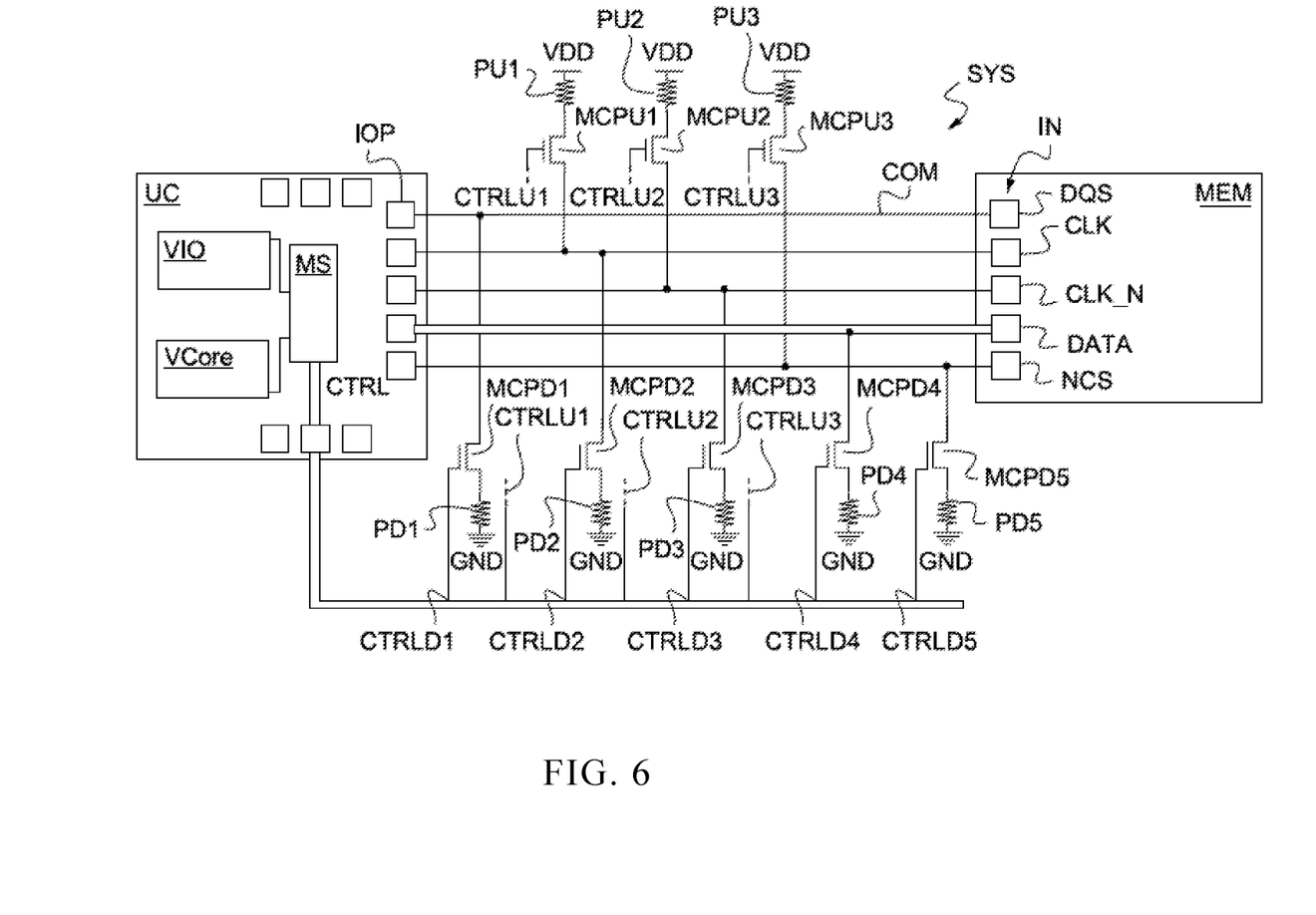
FIG. 6 illustrates a memory configuration system according to second embodiment.

Nevertheless, alternatively, the pull-up PU and pull-down PD resistors can be connected to the communication interface COM between the control unit UC and the memory MEM, as represented in FIG. 6.

In particular, FIG. 6 illustrates the memory configuration system according to a second embodiment wherein the system SYS is identical to the system SYS of FIG. 5 except that the pull-up PU and pull-down PD resistors and the switches MCPU and MCPD are connected to the communication interface COM while being placed outside the control unit UC.

The user can then devise a circuit including its own pull-up PU and pull-down PD resistors and its own switches MCPU and MCPD. This circuit can thus be connected to the communication interface COM and be controlled by a control unit UC not having circuitry for applying a logic state at the input IN of the memory MEM.

In the same FIG. 6, pull-up resistors PU1, PU2 and PU3 are connected to a power supply source VDD and are respectively connected to the sources of MCPU1, MCPU2 and MCPU3. The drains of MCPU1, MCPU2 and MCPU3 are respectively connected to the inputs CLK, CLK_N and NCS of the memory MEM. Pull-down resistors PD1, PD2, PD3, PD4 and PD5 are respectively connected to the sources of MCPD1, MCPD2, MCPD3, MCPD4. The drains of MCPD1, MCPD2, MCPD3, MCPD4 and MCPD5 are respectively connected to the inputs DQS, CLK, CLK_N, DATA and NCS of the memory MEM.

The control unit UC comprises a control bus CTRL connected to one of the input/output ports IOP thereof and several selection circuits MS. The selection circuits generate control signals CTRLU1, CTRLU2, CTRLU3, CTRLD1, CTRLD2, CTRLD3, CTRLD4 and CTRLD5 to control the switches MCPU1, MCPU2, MCPU3, MCPD1, MCPD2 MCPD3, MCPD4 and MCPD5. The control bus CTRL makes it possible to connect each selection circuit to the associated switch and then makes it possible to transmit the control signals to the switches.

Figure 7:
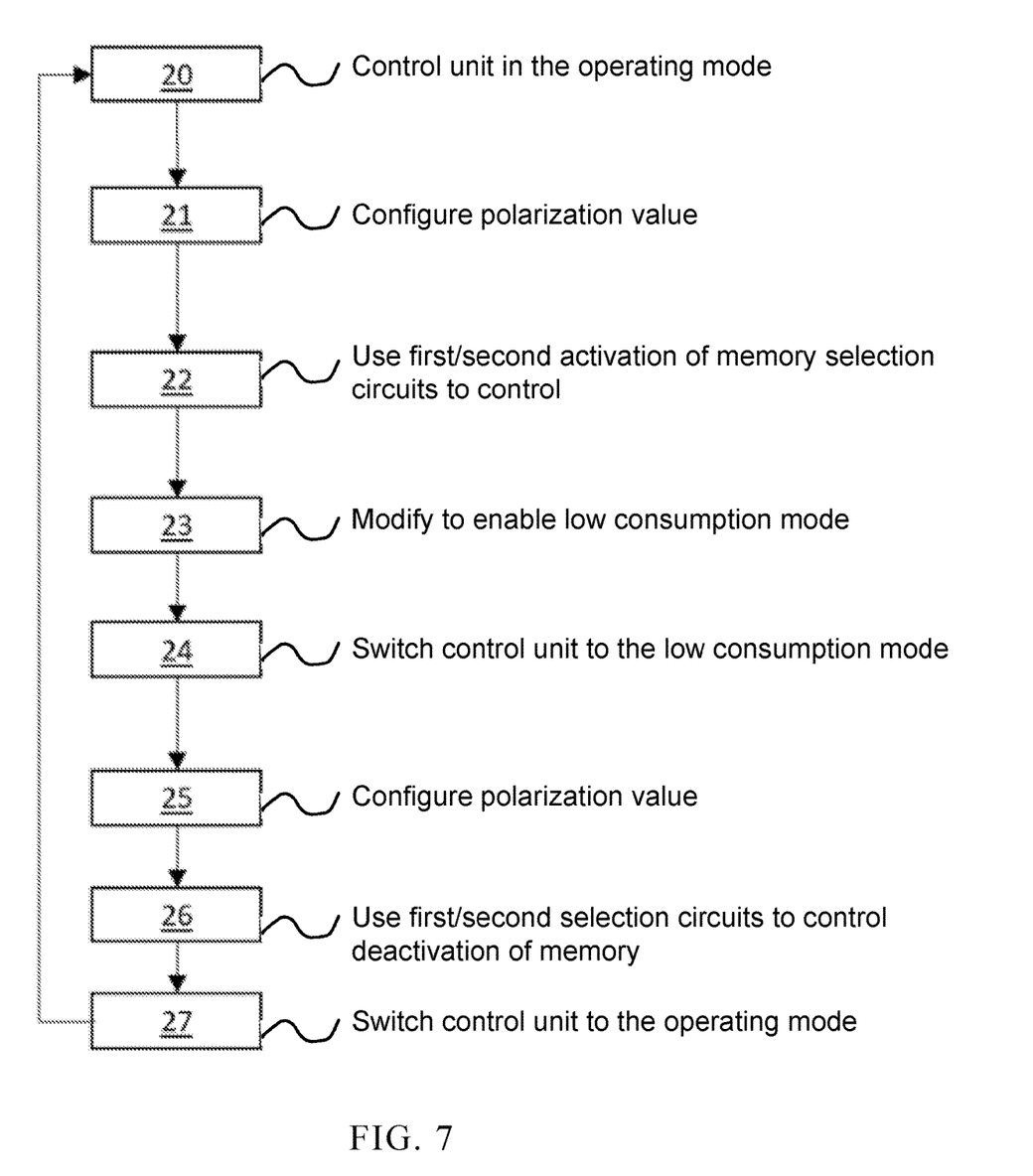
FIG. 7 illustrates an implementation of a method for configuring a memory.

FIG. 7 illustrates an implementation of a method for configuring a memory MEM, more specifically the configuration of the polarization value of the input IN on the memory MEM by a control unit UC electrically connected to the input IN of the memory MEM via a communication interface COM. This configuration method can be implemented by the system SYS described above.

This method comprises a configuration of the polarization value of the input IN of the memory MEM via the communication interface COM using the first configuration circuit CONF1 of the control unit UC when the control unit UC is in the operating mode or using the second configuration circuit CONF2 of the control unit UC when the control unit UC is in the low consumption mode.

In particular, the control unit UC is configured to receive instructions from a user and to change mode according to these instructions.

FIG. 7 illustrates more specifically an example of a method for configuring memory MEM wherein the control unit is first in the operating mode before subsequently switching to low consumption mode and then later returning to operating mode.

At step 20, the control unit UC is therefore in the operating mode and the sectors VCore and VIO are powered. The content of the registers APCR1 and APCR2 is set to '0' in order to prevent the configuration of the inputs IN of the memory MEM by the second configuration circuit CONF2. The first configuration circuit CONF1 use the value contained in the configuration registers VCORE_CR_PU and VCORE_CR_PD to generate the control signals PU_VCore and PD_VCore. As stated above, these signals PU_VCore and PD_VCore make it possible to configure the polarization value of the input IN of the memory MEM.

Moreover, the control unit UC generates a control signal OK_OUT of value '1' at the input of the selection circuits MS1 and MS2 when the control unit UC is in said operating mode.

The configuration method further comprises a selection step 21 by the selection circuits MS1 and MS2 of the first configuration circuit CONF1. This step 21 corresponds more specifically to the selection mentioned above of the control signals PU_VCore and PD_VCore generated by the first configuration circuit CONF1 to configure the polarization value of the input IN of the memory MEM.

At step 22, the selected control signal PU_VCore is transmitted by the selection circuit MS1 to the switch MCPU. According to the value of this control signal corresponding to the configuration to be applied at the input IN of the memory MEM, the switch MCPU can be on or off. Similarly, the selected control signal PD_VCore is transmitted by the selection circuit MS2 to the switch MCPD. According to the value of this control signal corresponding to the configuration to be applied at the input IN of the memory MEM, the switch MCPD can be on or off.

For example, the switch MCPD is on for a configuration value transmitted by the signal PD_VCore. The switch MCPD then activates the pull-down resistor PD to apply a low logic state to the input IN of the memory MEM.

Similarly, the switch MCPU is on for a configuration value transmitted by the signal PU_VCore. The switch MCPU then activates the pull-up resistor PU to apply a high logic state to the input IN of the memory MEM.

At step 23, the content of the configuration registers VIO_CR_PU and VIO_CR_PD and the content of the registers APCR1 and APCR2 are modified so as to enable the configuration of the input IN of the memory MEM by the second configuration circuit CONF2 when the control unit is in the low consumption mode. The operation of the registers VIO_CR_PU, VIO_CR_PD, APCR1 and APCR2 of the second configuration circuit CONF2 remains the same as that explained above.

At step 24, the control unit switches to low consumption mode. The power supply sector VCore is then switched off and the power supply sector VIO continues to be powered. The control unit UC generates a control signal OK_OUT of value '0' at the input of the selection circuits MS1 and MS2 and the control unit UC generates a signal ISO_PULSE at the input of the flip-flops D1 and D2. The second configuration circuit CONF2 then use the value contained in the configuration registers VIO_CR_PU and VIO_CR_PD to generate the control signals PU_VIO and PD_VIO. As stated above, these signals PU_VIO and PD_VIO make it possible to configure the polarization value of the input IN of the memory MEM.

The configuration method further comprises a selection step 25 by the selection circuits MS1 and MS2 of the second configuration circuit CONF2. This step 25 corresponds more specifically to the selection mentioned above of the control signals PU_VIO and PD_VIO generated by the second configuration circuit CONF2 to configure the polarization value of the input IN of the memory MEM.

At step 26, the selected control signal PU_VIO is transmitted by the selection circuit MS1 to the switch MCPU. According to the value of this control signal corresponding to the configuration to be applied at the input IN of the memory MEM, the switch MCPU can be on or off. Similarly, the selected control signal PD_VIO is transmitted by the selection circuit MS2 to the switch MCPD. According to the value of this control signal corresponding to the configuration to be applied at the input IN of the memory MEM, the switch MCPD can be on or off.

For example, the switch MCPD is on for a configuration value transmitted by the signal PD_VIO. The switch MCPD then activates the pull-down resistor PD to apply a low logic state to the input IN of the memory MEM.

Similarly, the switch MCPU is on for a configuration value transmitted by the signal PU_VIO. The switch MCPU then activates the pull-up resistor PU to apply a high logic state to the input IN of the memory MEM.

More specifically, a high logic state can be applied by the pull-up resistor PU3 to the input NCS of the memory MEM when MCPU3 is on at step 26. MCPU3 is on when the signal CTRLU3 is in the low logic state for example. The memory MEM is then deactivated, particularly when the control unit UC is in the low consumption mode and therefore when the signal CTRLU3 corresponds to the control signal PU_VIO generated by the second configuration circuit CONF2.

Finally, in a step 27, the control unit UC switches to operating mode, the power supply sector VCore is once again powered and the content of the registers VCORE_CR_PU and VCORE_CR_PD is reset. It is then necessary to modify the content of these registers VCORE_CR_PU and VCORE_CR_PD in order to enable the configuration of the inputs IN of the memory MEM by the first configuration circuit CONF1, and deactivate the second configuration circuit by setting to '0' the content of the registers APCR1 and APCR2. The method can then continue from step 20.

The invention claimed is:

1. A system, comprising:
a control unit electrically connectable to an input of a memory via a communication interface;
where the control unit includes two power supply sectors: a first power supply sector configured to be powered when the control unit is in an operating mode and to be switched off when the control unit is in a low consumption mode, and a second power supply sector configured to be powered when the control unit is in the operating mode and powered when the control unit is in the low consumption mode;
wherein the control unit includes:
in the first power supply sector, a first configuration circuit operating when the control unit is in the operating mode to configure a polarization value of said input of the memory via the communication interface; and
in the second power supply sector, a second configuration circuit operating when the control unit is in the low consumption mode to configure the polarization value of said input of the memory via the communication interface.

2. The system according to claim 1, further comprising selection circuitry configured to select said first configuration circuit to configure the polarization value of said input of the memory when the control unit is in the operating mode and select said second configuration circuit to configure the polarization value of said input of the memory when the control unit is in the low consumption mode.

3. The system according to claim 1, wherein the first and second configuration circuit are configured to apply one of a high logic state or a low logic state to the input of the memory.

4. The system according to claim 3, further comprising:
a pull-up resistor configured to be connected to said communication interface for applying the high logic state to the input of the memory;
a pull-down resistor configured to be connected to said communication interface for applying the low logic state to the input of the memory;
switches connected in series with the pull-up resistor and pull-down resistor that are selectively controlled to activate or deactivate said pull-up resistor and said pull-down resistor according to the logic state to be applied to the input of the memory defined by said first and second configuration circuits.

5. The system according to claim 4, wherein said pull-up resistor and said pull-down resistor are provided in an input/output port of the control unit configured to be connected to the input of the memory via said communication interface.

6. The system according to claim 4, further comprising:
the memory; and
said communication interface connecting the memory to the control unit;
wherein said pull-up resistor and said pull-down resistor are connected to the communication interface between the control unit and the memory.

7. The system according to claim 1, wherein the first configuration circuit comprises a configuration register defining a configuration of the polarization value of the input of the memory when the control unit is in the operating mode, said configuration register being provided in an input/output port of the control unit configured to be connected to the input of the memory via said communication interface.

8. The system according to claim 1, wherein the second configuration circuit comprise a configuration register defining a configuration of the polarization value of the input of the memory when the control unit is in the low consumption mode, said configuration register being provided in an input/output port of the control unit configured to be connected to the input of the memory via said communication interface.

9. The system according to claim 1, wherein the polarization value of the input of the memory to be configured operates to activate or deactivate the memory, and wherein the second configuration circuit operates to configure this polarization value of the input of the memory to deactivate the memory when the control unit is in the low consumption mode.

10. A method for configuring a polarization value of an input of a memory by a control unit electrically connected to the input of the memory via a communication interface, wherein control unit has two power supply sectors: a first power supply sector configured to be powered when the control unit is in an operating mode and to be switched off when the control unit is in a low consumption mode, and a second power supply sector configured to be powered when the control unit is in the operating mode and powered when the control unit is in the low consumption mode, the method comprising:
using a first configuration circuit of the control unit placed in the first power supply sector to configure the polarization value of the input of the memory via the communication interface when the control unit is in the operating mode; and using a second configuration circuit of the control unit placed in the second power supply sector to configure the polarization value of the input of the memory via the communication interface when the control unit is in the low consumption mode.

11. The method according to claim 10, further comprising:

selecting by selection circuits of said first configuration circuit to configure the polarization value of the input of the memory when the control unit is in the operating mode; and selecting by selection circuits of said second configuration circuit to configure the polarization value of the input of the memory when the control unit is in the low consumption mode.

12. The method according to claim 10, further comprising applying by the first and second configuration circuit of one of a high logic state or a low logic state to the input of the memory.

13. The method according to claim 12, wherein:

applying the high logic state comprises using a pull-up resistor configured to be connected to said communication interface;

applying the low logic state comprises using a pull-down resistor configured to be connected to said communication interface.

14. The method according to claim 13, further comprising:

selectively actuating a switch connected in series with said pull-up resistor according to the logic state to be applied to the input of the memory defined by one or more of the first and second configuration circuits to apply the high logic state; and selectively actuating a switch connected in series with said pull-down resistor according to the logic state to be applied to the input of the memory defined by one or more of the first and second configuration circuit to apply the low logic state.

15. The method according to claim 14, wherein said pull-up resistor and said pull-down resistor are provided in an input/output port of the control unit configured to be connected to the input of the memory via said communication interface.

16. The method according to claim 14, wherein said pull-up resistor and said pull-down resistor are connected to the communication interface between the control unit and the memory.

17. The method according to claim 10, further comprising loading the polarization value of the input of the memory in a configuration register comprised in the first configuration circuit when the control unit is in the operating mode, said configuration register being provided in an input/output port of the control unit configured to be connected to the input of the memory via said communication interface.

18. The method according to claim 10, loading the polarization value of the input of the memory in a configuration register comprised in the second configuration circuit when the control unit is in the low consumption mode, said configuration register being provided in an input/output port of the control unit configured to be connected to the input of the memory via said communication interface.

19. The method according to claim 10, wherein the polarization value of the input of the memory is applied to selectively activate or deactivate the memory, the method further comprising deactivating the memory during the configuration of the polarization value of the input of the memory by the second configuration circuit when the control unit is in the low consumption mode.

20. A system, comprising:

a control unit electrically connectable to an input of a memory via a communication interface;

where the control unit includes two power supply sectors:
a first power supply sector configured to be powered when the control unit is in an operating mode and to be switched off when the control unit is in a low consumption mode, and a second power supply sector configured to be powered when the control unit is in the operating mode and powered when the control unit is in the low consumption mode;

wherein the control unit includes:
in the first power supply sector, a first configuration circuit operating when the control unit is in the operating mode to generate a first polarization control signal;
in the second power supply sector, a second configuration circuit operating when the control unit is in the low consumption mode to generate a second polarization control signal;

a logic circuit configured to logically combine the first and second polarization control signals to generate a control signal; and a switch and resistor coupled in series between said input of the memory and a reference node, wherein said control signal controls actuation of said switch.

21. The system of claim 20, wherein said reference node is a voltage supply node and said resistor is a pull-up resistor.

22. The system of claim 20, wherein said reference node is a ground node and said resistor is a pull-down resistor.

* * * * *